United States Patent
Bear

(10) Patent No.: US 6,796,372 B2
(45) Date of Patent: Sep. 28, 2004

(54) SINGLE OR DUAL BUSS THERMAL TRANSFER SYSTEM

(75) Inventor: Daniel B. Bear, Delaware, OH (US)

(73) Assignee: Liebert Corporation, Columbus, OH (US)

( * ) Notice: Subject to any disclaimer, the term of this patent is extended or adjusted under 35 U.S.C. 154(b) by 0 days.

(21) Appl. No.: 10/167,997

(22) Filed: Jun. 12, 2002

(65) Prior Publication Data

US 2002/0185262 A1 Dec. 12, 2002

Related U.S. Application Data

(60) Provisional application No. 60/297,552, filed on Jun. 12, 2001.

(51) Int. Cl.[7] .............................................. F28D 15/00
(52) U.S. Cl. .......................... 165/104.21; 165/104.33; 165/185; 165/80.4; 174/15.2; 361/700; 257/714; 257/715
(58) Field of Search ....................... 165/104.26, 104.33, 165/80.4, 185; 174/15.2; 361/700; 257/714–716

(56) References Cited

U.S. PATENT DOCUMENTS

| | | | | |
|---|---|---|---|---|
| 3,904,933 A | * | 9/1975 | Davis .......................... 361/689 |
| 4,793,405 A | * | 12/1988 | Diggelmann et al. ... 165/104.33 |
| 4,958,257 A | | 9/1990 | Wenke ........................ 361/385 |
| 5,057,968 A | | 10/1991 | Morrison .................... 361/700 |
| 5,262,587 A | | 11/1993 | Moser ........................ 174/15.1 |
| 5,271,455 A | | 12/1993 | Semple ....................... 165/80.4 |
| 5,482,113 A | | 1/1996 | Agonafer et al. ............. 165/137 |
| 5,796,581 A | * | 8/1998 | Mok ........................... 359/432 |
| 5,924,481 A | | 7/1999 | Tajima ................... 165/104.33 |
| 5,963,425 A | | 10/1999 | Chrysler et al. ............. 361/695 |
| 5,982,616 A | | 11/1999 | Moore ........................ 361/687 |
| 5,986,882 A | | 11/1999 | Ekrot et al. ................. 361/687 |
| 6,000,125 A | | 12/1999 | Kang ........................... 29/832 |
| 6,034,872 A | | 3/2000 | Chrysler et al. ............. 361/699 |
| 6,052,285 A | * | 4/2000 | Hileman ...................... 361/699 |
| 6,058,010 A | | 5/2000 | Schmidt et al. ............. 361/689 |
| 6,097,596 A | * | 8/2000 | Cipolla et al. .............. 361/687 |
| 6,111,748 A | * | 8/2000 | Bhatia ........................ 361/695 |
| 6,166,907 A | | 12/2000 | Chien ......................... 361/699 |
| 6,181,553 B1 | * | 1/2001 | Cipolla et al. .............. 361/687 |
| 6,305,180 B1 | | 10/2001 | Miller et al. ................ 62/259.2 |
| 6,360,813 B1 | * | 3/2002 | Katoh et al. ........... 165/104.33 |
| 6,377,452 B1 | * | 4/2002 | Sasaki et al. ................ 361/687 |
| 6,377,453 B1 | | 4/2002 | Belady ........................ 361/687 |
| 6,489,049 B1 | * | 12/2002 | Johnson ........................ 429/13 |

FOREIGN PATENT DOCUMENTS

| | | | |
|---|---|---|---|
| EP | 0313473 A | 4/1989 | |
| EP | 0390053 | 3/1990 | ............ H05K/7/20 |
| WO | WO97/15801 | 5/1997 | ............ F28F/3/12 |
| WO | WO 02 102124 A3 | 3/2003 | ............ H05K/7/20 |

OTHER PUBLICATIONS

Partial International Search for PCT/US02/18835.

* cited by examiner

*Primary Examiner*—Terrell Mckinnon
(74) *Attorney, Agent, or Firm*—Howrey Simon Arnold & White, LLP

(57) ABSTRACT

A cooling system for use in conjunction with electronic devices (such as a computer) is disclosed. The cooling system is composed of several segments that comprise a continuous thermal path from the heat producing electronic component to a primary fluid circuit. The system transfers the heat to a secondary fluid circuit. The primary circuit is sealed and allows the transfer of heat to the secondary circuit without the requirements of the secondary fluid being directly connected through hoses or other means to the electronic device.

26 Claims, 9 Drawing Sheets

SINGLE OR DUAL BUSS THERMAL TRANSFER SYSTEM

CROSS REFERENCE TO RELATED APPLICATIONS

This application claims priority to U.S. Provisional Application Ser. No. 60/297,552, filed Jun. 12, 2001, entitled "Emerging Cooling Requirements and Systems in Telecommunications Spaces" by Daniel B. Baer, the entirety of which is hereby incorporated by reference.

BACKGROUND OF THE INVENTION

It is common practice for electronic systems, such as computers or servers, to reject the heat produced by electronic components, such as the microprocessor, via air-cooled heat sinks. As the amount of this heat increases, this process is typically enhanced by employing extended surfaces on the heat sink, such as fins, and often the addition of a fan to force cooling air over the fins. However, as the amount of heat and the heat concentration increases, these practices can be insufficient for the required component heat flux or operating temperature. Also, as these higher power components continue to shrink in size, the number included in a given volume increases. Because of the increased density, the amount of heat rejected to the surrounding air can become too great for the air and/or the air-conditioning system to absorb. For example, many present electronic devices, such as computer servers, telecommunications switches, routers, etc., are manufactured in industry standard dimensions for installation in racks where as many as forty-two (42) units can be installed in a vertical stack. Each server may have two microprocessors, rejecting over 132 watts each, resulting in more than 11 kW of heat being released by just the microprocessors. This heat concentration far exceeds the ability of typical air cooling systems to absorb the heat.

Fluid circuits have been used in the prior art to channel the high heat release of "supercomputers", but these systems have required special thermal conduction modules and intricate pumping, piping and cooling circuits within the computers. These internal cooling circuits also required special methods for servicing and replacing components and modules, preventing this technique from gaining wide acceptance and use. Additionally, there is also a reluctance to introduce a large amount of conductive fluid, such as water, into the computer because of potential electric safety issues.

The present invention overcomes the problems recited above and the deficiencies of the prior art by providing a thermal path for the generated heat that has a higher cooling capacity than simple air cooling but that does not require the manufacturer of the electronic or computer equipment to physically connect the ultimate heat absorbing fluid to each electronic device. Therefore, there is no need to introduce cooling fluid into the electronic enclosure, solving many of the problems with fluid cooling identified above.

Not all heat producing components in the electronic system may require cooling directly through this thermal path, and may continue to release their heat to air. One embodiment of the present invention adds extended surfaces to the final heat exchanger to absorb this heat. Furthermore, the importance of these electronic systems may be such that continuous operation is essential, as they may be sued for sales, communication, or other critical operational functions that must always be on-line. Therefore, a second, redundant cooling circuit may be provided to ensure continuous operation in the event of a failure of either cooling circuit.

SUMMARY OF THE INVENTION

The present invention solves the above-identified problems of the prior art in its various embodiments.

In one embodiment, the present invention comprises a cold plate, pump, intermediate heat exchanger, final heat absorber, and a small amount of thermal fluid. The cold plate is thermally connected to the heat generating electronic component. The pump circulates the thermal fluid employed to absorb the heat. The intermediate heat exchanger then transfers the heat to the final heat absorber.

The circuit comprising the cold plate, pump and intermediate heat exchanger is a sealed system. The cold plate and the intermediate heat exchanger may include thermal enhancing techniques such as unique flow channels or internally extended surfaces to improve their ability to absorb or transmit the heat. Thermal tapes or other materials may be employed to reduce the thermal resistances in the circuit. The fluid may be water, a dielectric fluid, a refrigerant, or other suitable thermal chemical. The final heat absorber may also include thermal enhancing techniques to improve its thermal performance. The thermal fluid employed in the final heat exchanger may also be water, a dielectric fluid, a refrigerant, or other suitable thermal chemical.

In an alternative embodiment, the present invention comprises a heat pipe, intermediate heat exchanger, final heat absorber, and a small amount of thermal fluid. The heat pipe consists of an evaporator, condenser, and interconnecting tube. The evaporator is thermally connected to the heat generating electronic component. The thermal fluid transmits the heat from the evaporator to the condenser through the tube via the mechanisms of vapor pressure and/or wicking. The condenser is thermally connected to the intermediate heat exchanger, which then transfers the heat to the final heat absorber.

The heat pipe is a sealed system. The evaporator, condenser, and intermediate heat exchanger may include thermal enhancing techniques such as unique flow channels or internally extended surfaces to improve their ability to absorb or transmit the heat. Thermal tapes or other materials may be employed to reduce the thermal resistances in the circuit. The fluid may be water, a dielectric fluid, a refrigerant, or other suitable thermal chemical. The final heat absorber may also include thermal enhancing techniques to improve its thermal performance. The thermal fluid employed in the final heat exchanger may also be water, a dielectric fluid, a refrigerant, or other suitable thermal chemical.

DESCRIPTION OF ILLUSTRATIVE EMBODIMENTS

Figure 1A:
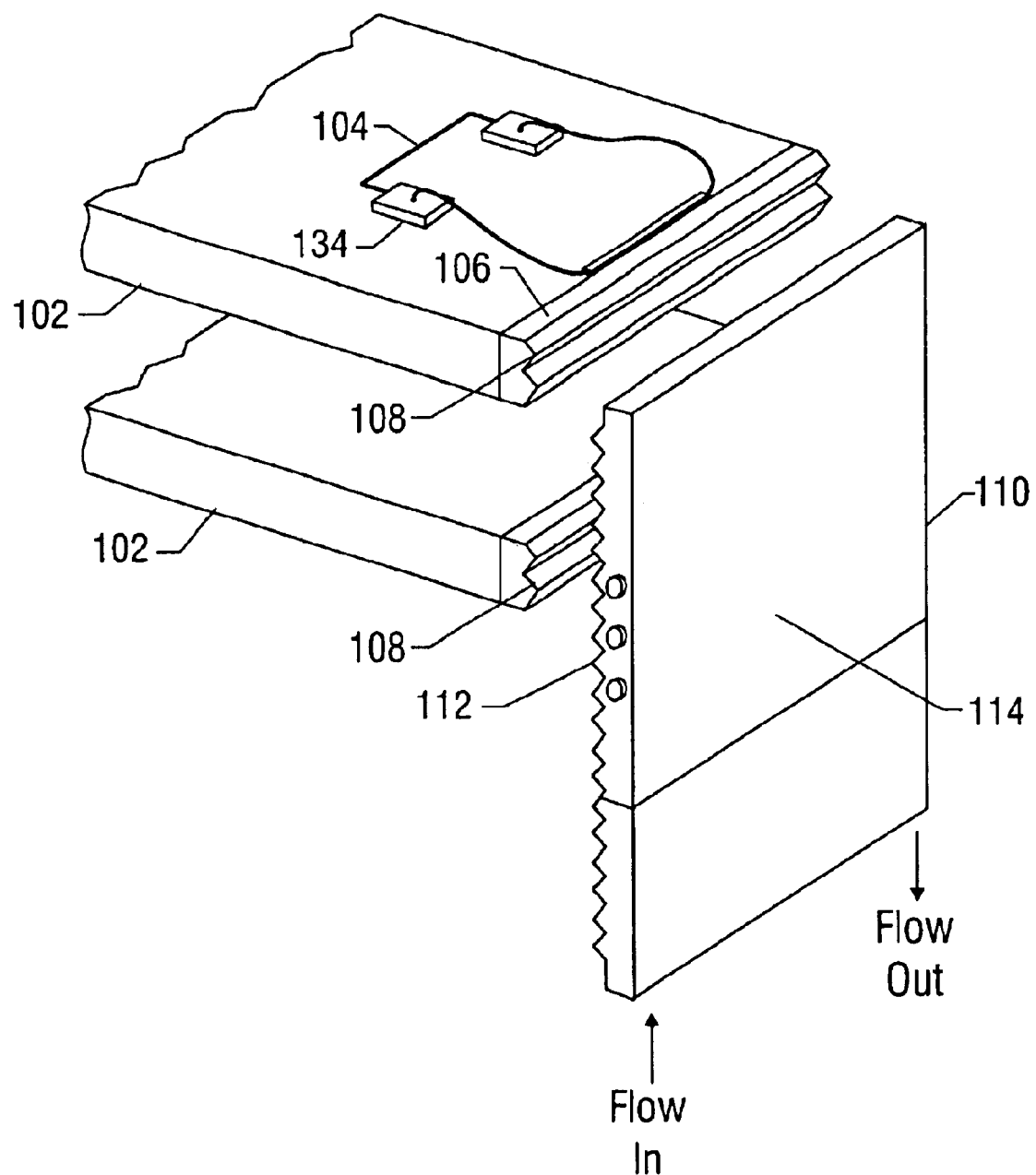
FIG. 1A is a depiction of a cooling system in accordance with the present invention.
Figure 1B:
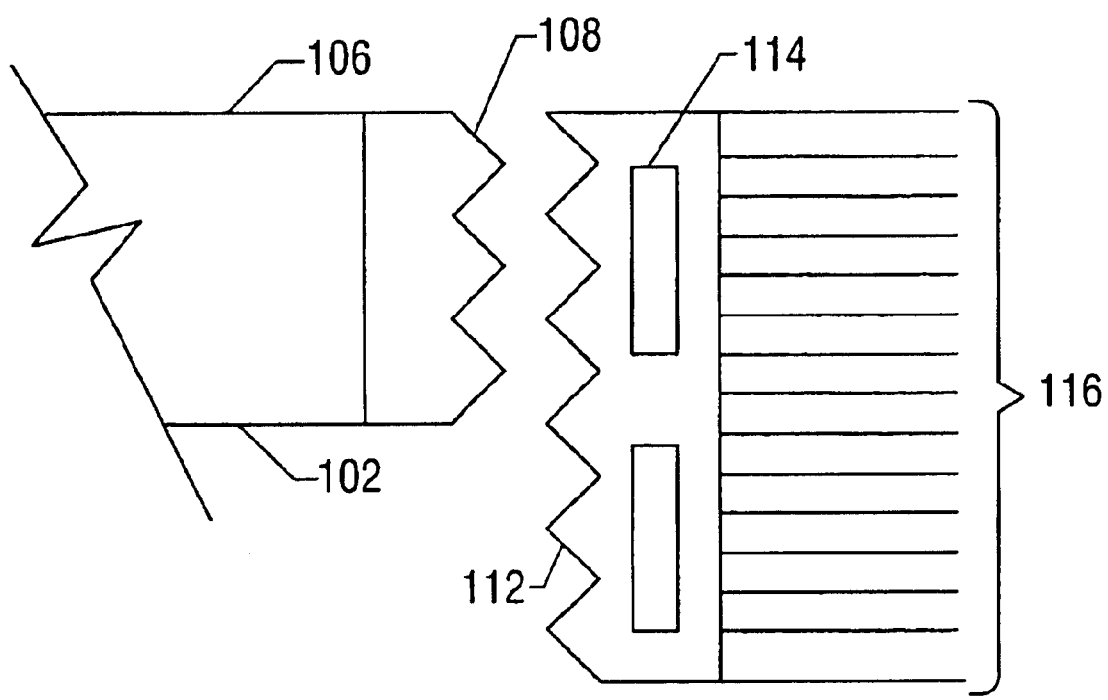
FIG. 1B is a schematic depiction of the cooling system depicted in FIG. 1A.
Figure 1C:
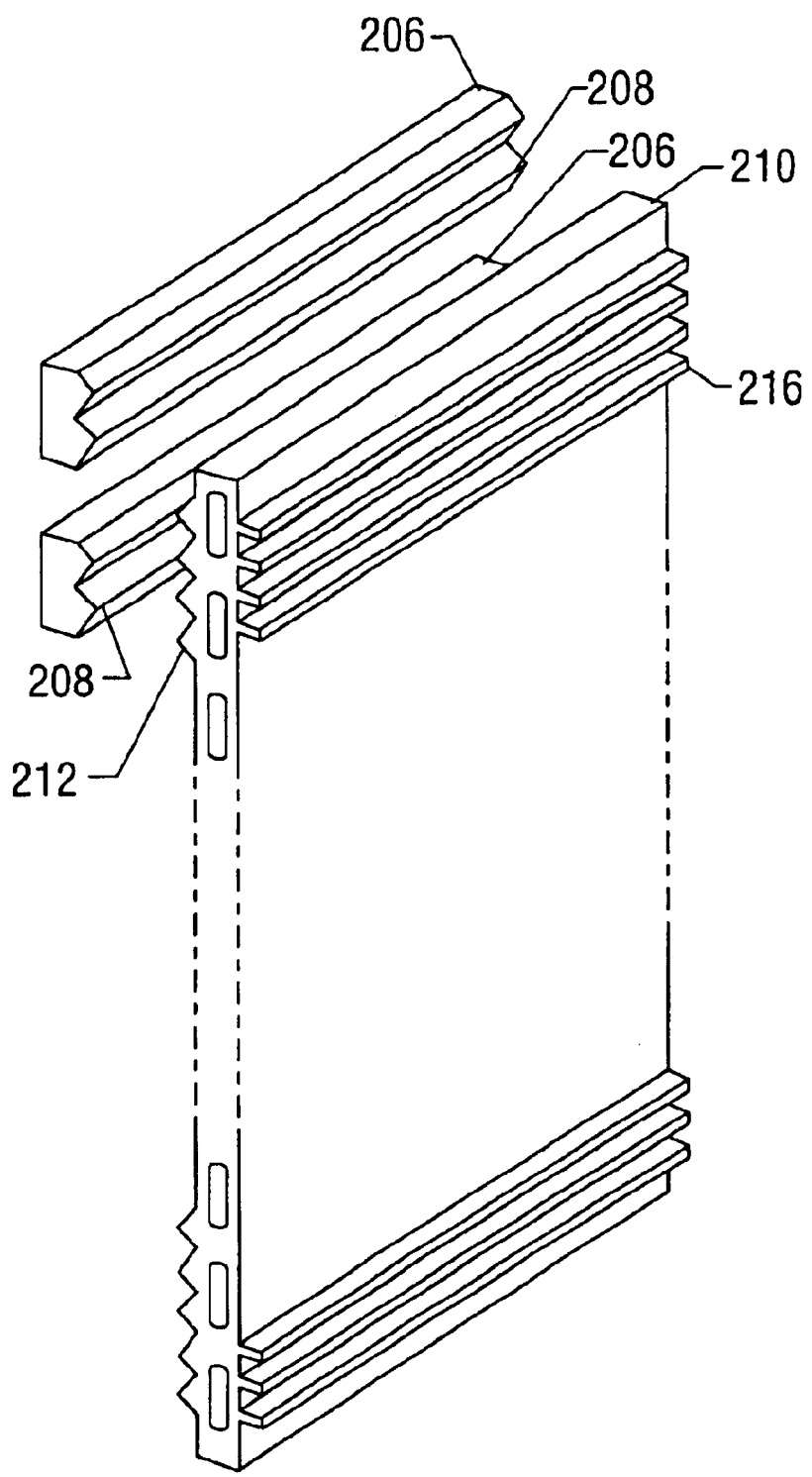
FIG. 1C is a depiction of the cooling system depicted in FIG. 1A showing extended surfaces on the final heat absorber for cooling of air cooled equipment.
Figure 1D:
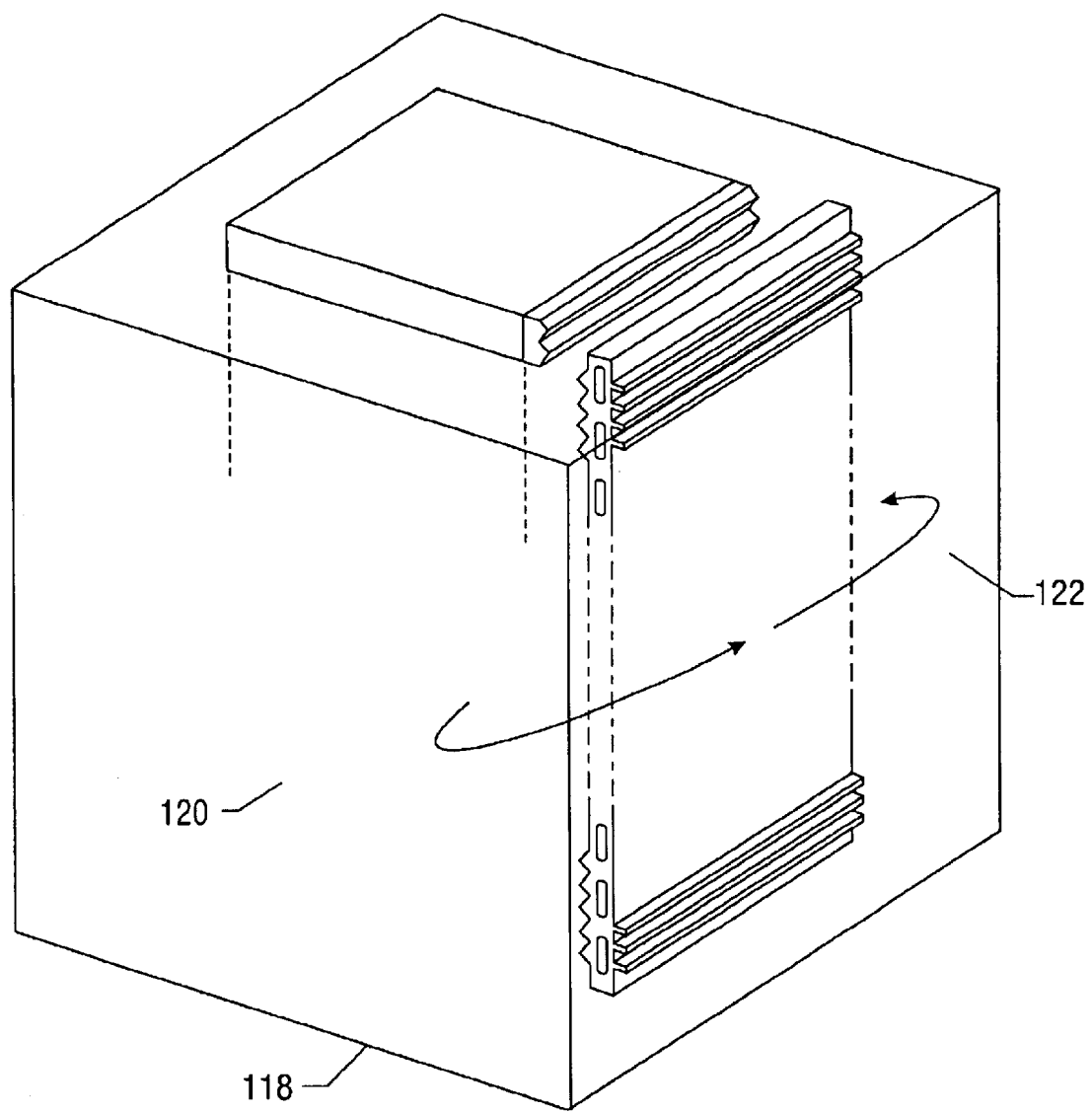
FIG. 1D is a depiction of a cooling system in accordance with the present invention housed in an enclosure.

Turning now to FIGS. 1A–D, a cooling system in accordance with the present invention is illustrated. A schematic view of this arrangement is indicated in FIG. 1B, which includes the same reference numbers. Rack mount electronic devices 102, mounted in enclosure 118 are the equipment to be cooled. The particular units illustrated are dual-processor computer servers, but the invention is applicable to any electronic devices containing heat generating components. The cold plate 104 is located directly on the microprocessor and piped directly to the intermediate heat exchanger 106 then to the pump 134 and returned to the cold plate, forming a continuous fluid circuit. The intermediate heat exchanger 106 is located directly on the final heat absorber 110.

Intermediate heat exchanger 106 is constructed from a suitable thermally conductive material, many examples of which are known in the art of heat sink construction. Intermediate heat exchanger 106 is shaped so as to have a plurality of intermediate heat exchanger mating surfaces 108. The intermediate heat exchanger mating surfaces 108 are illustrated as being triangular in shape so as to interlock with final heat absorber mating surfaces 112 on final heat absorber 110. However, it should be understood that any shape for intermediate heat exchanger mating surfaces 108 and the final heat absorber mating surfaces 112 is acceptable, so long as the shapes are capable of tight interlocking to establish a heat flow path. Final heat absorber 110 is formed of a thermally conductive material, and includes within its structure a plurality of cooling fluid channels 114. When final heat absorber 110 is tightly mechanically connected to intermediate heat exchanger 106 such that intermediate heat exchanger mating surfaces 108 tightly interlock with final heat absorber mating surfaces 112, a heat transfer path is established.

By using this arrangement, heat generated by the electronic devices 102 is absorbed by cold plate 104 and transferred by the thermal fluid to intermediate heat exchanger 106. As noted above, heat then flows from intermediate heat exchanger 106 to final heat absorber 110. The heat is removed from final heat absorber 110 by the cooling fluid circulating through cooling fluid channels 114. The cooling fluid is circulated by a pump (not shown) and is cooled by a remote cooling system (not shown). The remote cooling system may be any sort of fluid cooling arrangement, such as chillers, etc., which are well known in the art.

It may not be necessary for all of the electronic equipment installed within enclosure 118 to be attached by a cold plate to intermediate heat exchanger 106. For example, many peripheral devices may still rely on convection and air cooling. Such devices may also be advantageously used with the present invention. Particularly, heated air 120 exiting these additional electronic devices flow through extended surfaces 116 of final heat absorber 116, resulting in cooled air stream 122 returning to the electronic devices.

A particularly advantageous aspect of this arrangement is that the electronic equipment maker must merely build a device to industry standard rack mount dimensions, which will slide into the assembly with heat absorbers. It is not necessary for the electronic equipment manufacturer to introduce fluid cooling into the electronic equipment, thereby eliminating a potential electrical hazard.

Figures 2A, 2B, 2C:
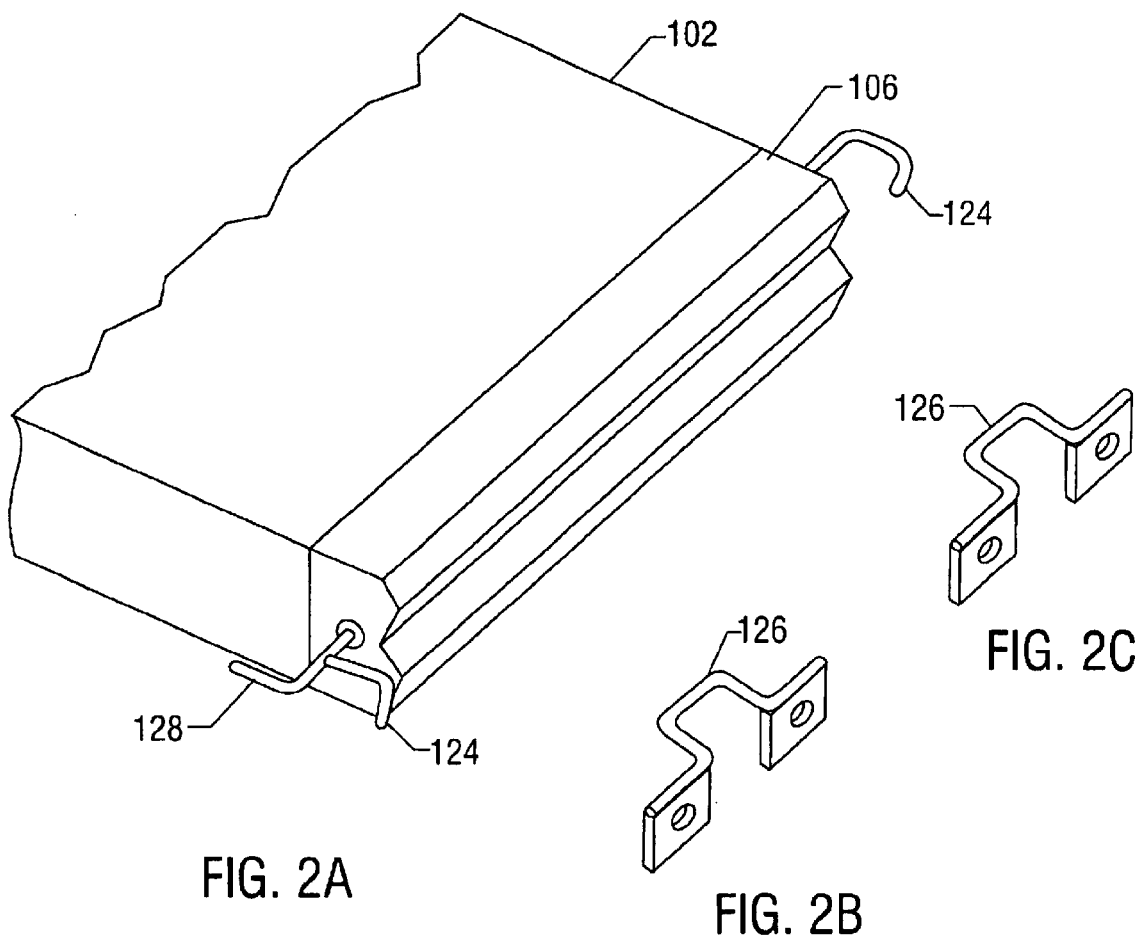
FIG. 2 illustrates a system for mechanically securing the cooling system of the present invention.

As noted above, operation of the present invention depends on a low resistance thermal path from cold plate 106 to intermediate heat exchanger 110. One mechanism of providing this thermal path is to provide a tight mechanical connection between the intermediate heat exchanger and the final heat absorber 112. This tight mechanical connection may be provided by various mechanical means. For example, FIG. 2 illustrates a system of locking arms and mating hooks for tightly securing the intermediate heat exchanger 110 to the final heat absorber 112 (not shown).

Mating hooks 126 may be installed on the intermediate heat exchanger or at a suitable location in the enclosure. Locking arms 124, which are mechanically affixed to the intermediate heat exchanger 106 may then be inserted into mating hooks 126. The mechanical attachment of locking arms 124 to the final heat absorber 110 should be on some sort of tightenable closure mechanism, actuated, for example, by crank handle 128. Once the locking arms are inserted into the mating hooks 126, the crank handle may be tightened so as to form a tight and secure mechanical attachment. It is noted that the arrangement of the locking arms 124, mating hooks 126 and crank handle 128 should be such that they do not interfere with installing the electronic devices 102 into enclosure 118 and crank handle 128 should be accessible after electronic devices 102 are installed into enclosure 118. Mechanical details of this arrangement have been omitted for clarity, but would be clearly understood by one of ordinary skill in the art.

Figure 3:
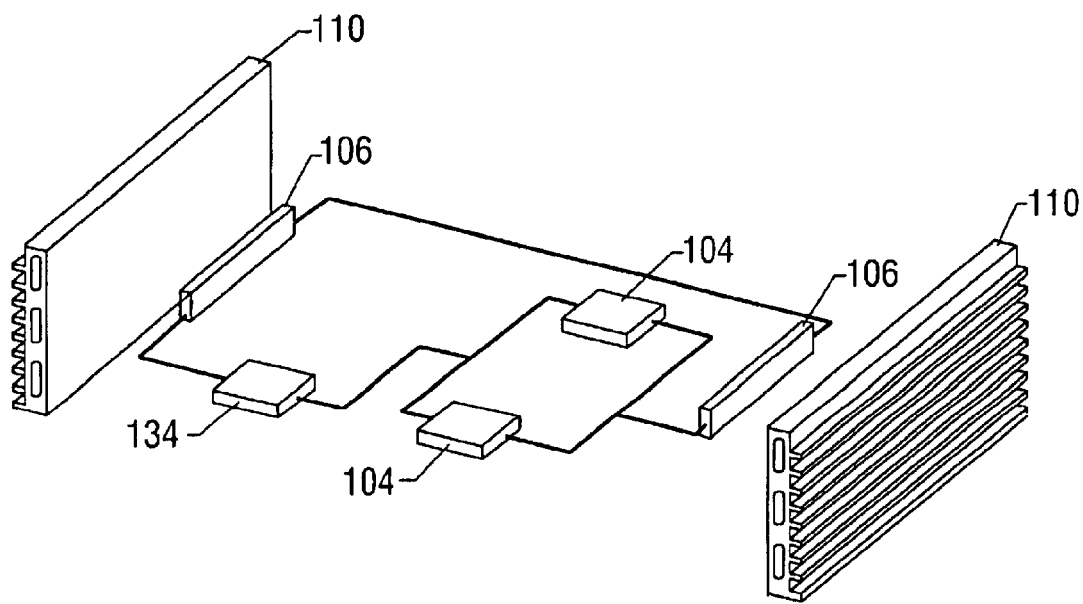
FIG. 3 illustrates illustrates a dual bus pump circuit arrangement of the present invention.

FIG. 3 illustrates and embodiment of the present invention having dual cold plates 104. Such a system would be useful, for example, dual processor computer systems. Additionally, a second, redundant set of intermediate heat exchanger '06 and final heat absorber 110 is provided, providing a second path for rejecting heat generated by the electronic devices to a remote cooling system.

Figure 4:
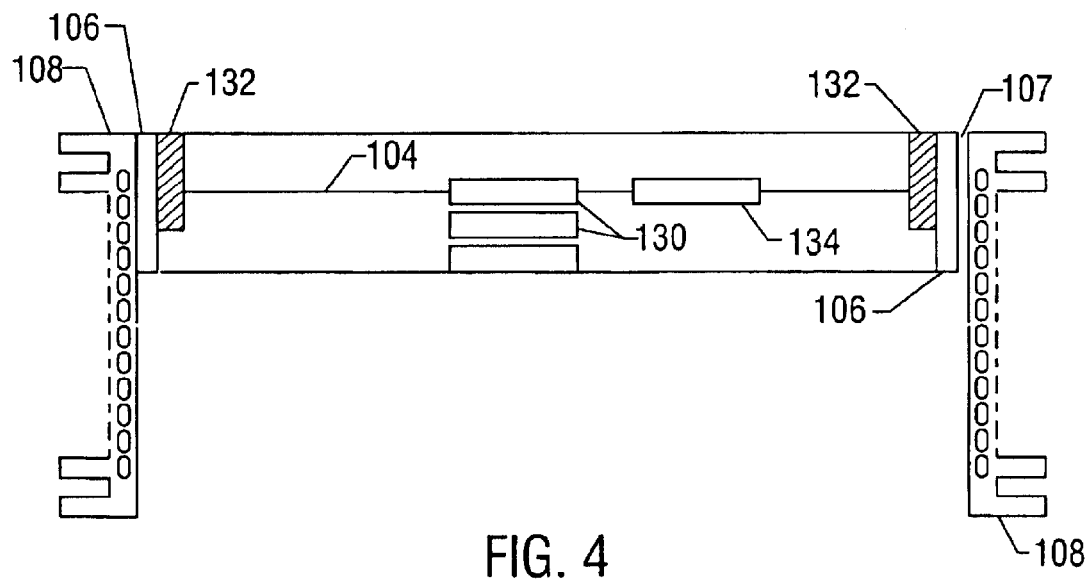
FIG. 4 further illustrates the embodiment of FIG. 3.

FIG. 4 illustrates an embodiment of the invention with a second, redundant set of intermediate heat exchanger 106 and final heat absorbers 110 providing a second path for rejecting heat generated by the electronic devices to a remote cooling system.

A pump that is particularly useful in this embodiment is a Proton Exchange Membrane (PEM) Pump manufactured by ChemEnergy in Atlanta, Ga. The PEM Pump uses proton exchange membranes substantially similar to those used in fuel cells. The pump has two chambers. Each chamber is divided by a membrane having water on one side and hydrogen on other side. By applying a voltage to the membrane, hydrogen is moved across the membrane, forcing the water out of the chamber. By alternating between the two chambers, it is possible to create an oscillatory movement of the water from one chamber to the other, e.g., from the evaporator 130 to the condenser 132 and back. A benefit of using this type of pump is that it does not include any bearings, impellers, motors, lubrication, etc. All that is required is a potential difference to force hydrogen across the membranes and therefore force water out of the chambers. As a result, this pump produces no vibration and has low power consumption.

As an alternative to the oscillatory motion described above, it is also possible, by judicious arrangement of piping and check valves to make the pump flow circuit "linear"or unidirectional. The inventor has determined that this arrangement provides superior results to the oscillatory system described above. By providing a unidirectional flow circuit, the system is able to reach steady state, resulting in relatively constant temperatures at various points of the system. Conversely, when using the oscillatory arrangement described in the preceding paragraph, temperature oscillations are induced at various points in the system.

Figure 5:
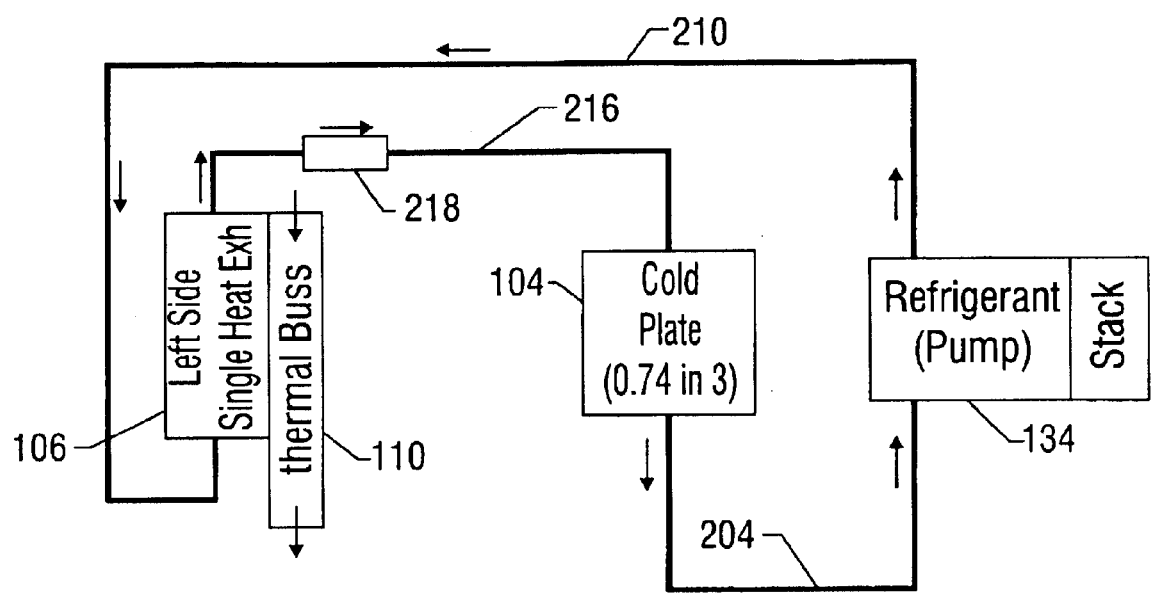
FIG. 5 illustrates a flow schematic for a single buss cooling system in accordance with the present invention.
Figure 6:
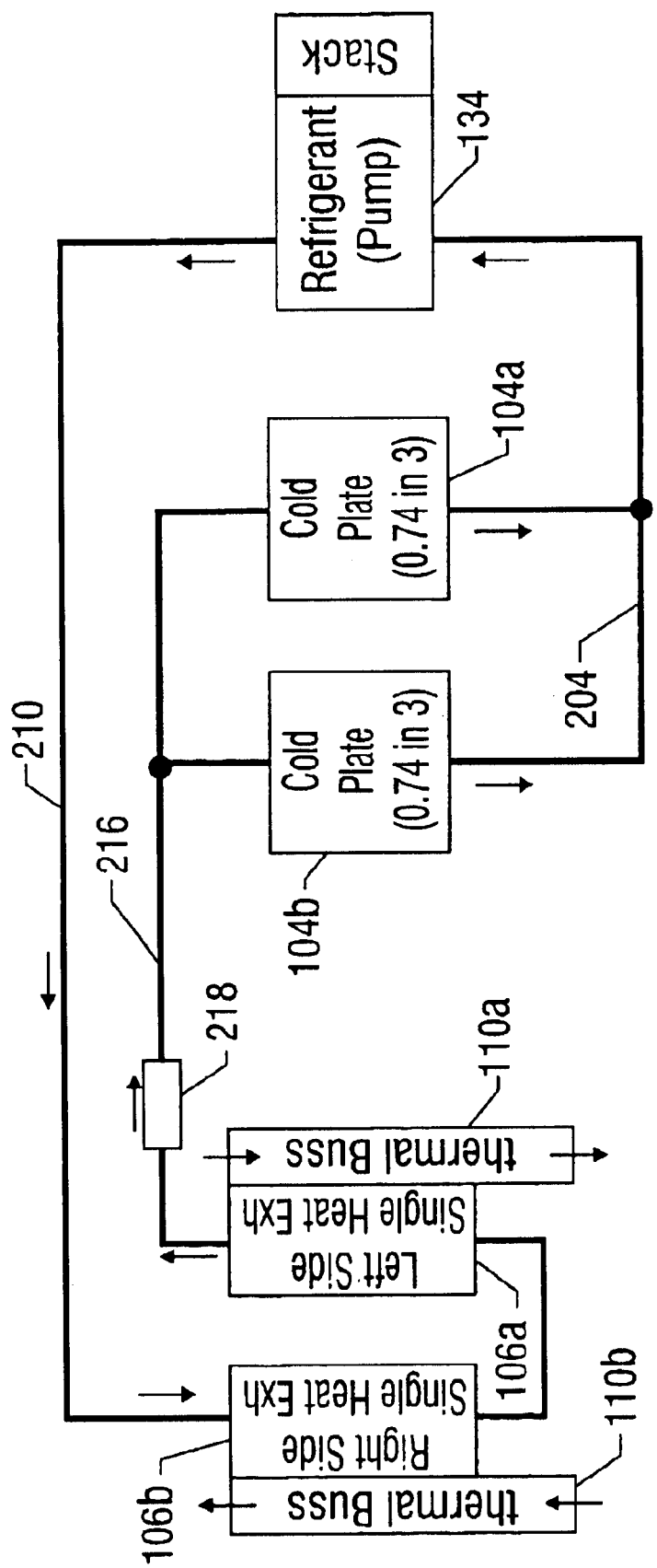
FIG. 6 illustrates a flow schematic for a dual buss cooling system in accordance with the present invention.

FIGS. 5 and 6 illustrate flow schematics for alternative single buss and dual buss cooling systems in accordance with the present invention. The schematics illustrated are for a circuit utilizing a refrigerant that undergoes a phase change, but, as noted previously, other thermal fluids can be used. FIG. 5 is flow schematic for the single system. A refrigerant liquid is vaporized in the cold plate 104 by heat generated by an electronic device adjacent thereto (not shown). The vaporized refrigerant flows through suction line 204 of pump 134. Refrigerant vapor is pumped through discharge line 210 by pump 134 to intermediate heat exchanger 106. Final heat absorber 110 is disposed adjacent intermediate heat exchanger 106 whereby heat is removed from the refrigerant, causing it to condense to a liquid state. Liquid refrigerant then flows through liquid refrigerant line 216, which may also include restricter 218 to return to cold plate 104.

FIG. 6, bearing like reference numerals to FIG. 5 illustrates a flow schematic for a dual bus system. As can be appreciated from the diagram shown, cold plates 104a and 104b each correspond to a heat source. Although cold plates 104a and 104b are shown connected to the refrigerant circuit in parallel, it would also be possible to have them connected to the refrigerant circuit in series. Further, it can be appreciated that the two intermediate heat exchangers 106a and 106b are connected to the refrigerant circuit in series, but could also be connected to the refrigerant circuit in parallel.

Additionally, it has been determined that there is an advantage in using some form of refrigerant, e.g. fluorocarbons or chloro-fluorocarbons, rather than water as the heat exchange fluid. As is known by those skilled in the art, by using a refrigerant it is possible to accomplish significant heat transfer at a substantially constant temperature by use of the beneficial phase change characteristics of the refrigerant fluid. This allows more heat to be absorbed for a given volume of refrigerant. By use of a refrigerant, it is possible to reduce the temperature of the cold plate to 10 degrees Celsius and lower. In this case, refrigerant pump 134 operates as a compressor rather than as a pump.

Figure 7:
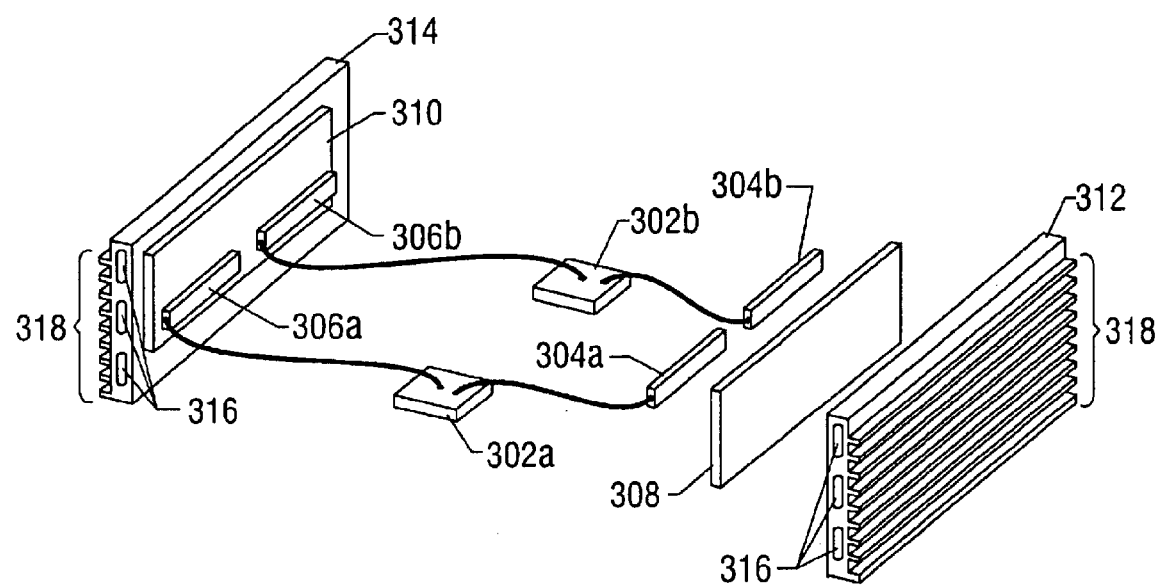
FIG. 7 illustrates a cooling system in accordance with the present invention using a heat pipe rather than a pumped cooling circuit.

Turning now to FIG. 7, a cooling system in accordance with the present invention using heat pipes rather than cold plates is illustrated. The depiction in FIG. 7 is a dual bus arrangement, and the heat pipe circuits each include dual evaporators. It will be understood by one having skill in the art that it would be possible to use such a system with a single evaporator and with heat pipe systems having only one condenser. Further, the system illustrated in FIG. 7 includes dual intermediate heat exchangers and dual final heat absorbers. Again, a functional system in accordance with the present invention can be constructed with only a single intermediate heat exchanger and a single final heat absorber.

Rack mount electronic devices (not shown), mounted in enclosure (not shown) are the equipment to be cooled. The particular units illustrated are dual-processor computer servers, but the invention is applicable to any electronic devices containing heat generating components. The evaporators 302a and 302b are located directly on the microprocessors or other heat generating components (not shown). As noted above, the present invention is also applicable to single evaporator systems. The condensers 304a and 304b and 306a and 306b are located directly on the intermediate heat exchangers 308 and 310. As noted above, only a single condenser is needed for each heat pipe circuit, and only a single intermediate heat exchanger and final heat absorber is required. The interconnecting tubing forms the conduit for heat transferred via the thermal fluid.

Intermediate heat exchangers 308 and 310 are constructed from a suitable thermally conductive material, many examples of which are known in the art of heat sink construction. The intermediate heat exchangers are shaped as described in connection with the other embodiments so as to have a plurality of mating surfaces not shown in FIG. 7 for clarity. As noted above, a preferred shape for the mating surfaces is a substantially triangular cross section, but it should be understood that any shape for the mating surfaces is acceptable, so long as the shapes are capable of tight interlocking to establish a heat flow path. Final heat absorbers 312 and 314 are is formed of a thermally conductive material, and includes within its structure a plurality of cooling fluid channels 316. When intermediate heat exchangers are tightly mechanically connected to final heat absorbers, a heat transfer path is established.

By using this arrangement, heat generated by the electronic devices is absorbed by evaporator 302 and transferred by the thermal fluid to the condenser 304 (and optionally 306), and then to the intermediate heat exchanger 308 (and optionally 310). The heat is then removed from final heat absorber(s) by the cooling fluid circulating through cooling fluid channels 316. The cooling fluid is circulated by a pump (not shown) and is cooled by a remote cooling system (not shown). The remote cooling system may be any sort of fluid cooling arrangement, such as chillers, etc., which are well known in the art.

It may not be necessary for all of the electronic equipment to be attached by a heat pipe to the intermediate heat exchanger(s). For example, many peripheral devices may still rely on convection and air cooling. Such devices may also be advantageously used with the present invention. Particularly, heated air exiting these additional electronic devices flow through extended surfaces 318 of final heat absorber(s), resulting in cooled air stream returning to the electronic devices.

A particularly advantageous aspect of this arrangement is that the electronic equipment maker must merely build a device to industry standard rack mount dimensions, which will slide into the assembly with heat absorbers. It is not necessary for the electronic equipment manufacturer to introduce fluid cooling into the electronic equipment, thereby eliminating a potential electrical hazard.

Various embodiments of the present invention have been illustrated and discussed herein. Further variations will be obvious to one of ordinary skill in the art having the benefit of this disclosure. It is therefore intended that the scope of the invention be limited only by the scope of the appended claims.

REFERENCES

The following references, to the extent that they provide exemplary procedural or other details supplementary to those set forth herein, are specifically incorporated herein by reference.

U.S. patent application Ser. No. 09/907,324, filed Jul. 17, 2001, entitled "High Availability Energy", naming as inventor Edward K. Feeney

What is claimed is:

1. A cooling system for an electronic device containing a heat generating component, the cooling system comprising:
    a heat pipe circuit comprising:
        an evaporator disposed adjacent to and in thermal communication with the heat generating component;
        at least one condenser disposed adjacent to and in thermal communication with at least one intermediate heat exchanger located at an exterior surface of the electronic device; and
        a fluid connection between the evaporator and the at least one condenser;
    a thermal fluid contained within the heat pipe circuit; and
    a final heat absorber disposed adjacent to and in thermal communication with the at least one intermediate heat exchanger, wherein said final heat absorber is adapted for fluid circulation to remove heat from the at least one intermediate heat exchanger to a location remote from said electronic device, and wherein the at least one intermediate heat exchanger and the final heat absorber further comprise complementary interlocking heat exchange surfaces.

2. The cooling system of claim 1 wherein the interlocking heat exchange surfaces are substantially triangular in cross section.

3. The cooling system of claim 1 wherein thermal tape is provided at the interface between the at least one intermediate heat exchanger and the final heat absorber to provide for enhanced thermal transfer.

4. The cooling system of claim 1 further comprising a pump for circulating the thermal fluid disposed in the heat pipe circuit.

5. The cooling system of claim 4 wherein the pump is a proton exchange membrane pump.

6. The cooling system of claim 1 wherein the thermal fluid is water, a dielectric fluid, or a refrigerant.

7. The cooling system of claim 1 wherein said complementary interlocking heat exchange surfaces are configured to permit separation of the electronic device from the cooling system without disassembly of a fluid connection.

8. The cooling system of claim 1 wherein said at least one condenser comprises a plurality of condensers.

9. The cooling system of claim 8 wherein at least two of said plurality of condensers are in thermal communication with different intermediate heat exchangers.

10. A cooling system for an electronic device containing a plurality of heat generating components, the cooling system comprising:
    a heat pipe circuit comprising:
        a plurality of evaporators, each evaporator being disposed adjacent to and in thermal communication with one of the heat generating components;
        at least one condenser disposed adjacent to and in thermal communication with at least one intermediate heat exchanger located at an exterior surface of the electronic device; and
        a fluid connection between the plurality of evaporators and the at least one condenser;
    a thermal fluid contained within the heat pipe circuit; and
    a final heat absorber disposed adjacent to and in thermal communication with the at least one intermediate heat exchanger, wherein said final heat absorber is adapted for fluid circulation to remove heat from the at least one intermediate heat exchanger to a location remote from said electronic device, and wherein the at least one intermediate heat exchanger and the final heat absorber further comprise complementary interlocking heat exchange surfaces.

11. The cooling system of claim 10 wherein the evaporators are connected in parallel in the heat pipe circuit.

12. The cooling system of claim 10 wherein the interlocking heat exchange surfaces are substantially triangular in cross section.

13. The cooling system of claim 10 wherein thermal tape is provided at the interface between the at least one intermediate heat exchanger and the final heat absorber to provide for enhanced thermal transfer.

14. The cooling system of claim 10 further comprising a pump for circulating the thermal fluid disposed in the heat pipe circuit.

15. The cooling system of claim 14 wherein the pump is a proton exchange membrane pump.

16. The cooling system of claim 10 wherein the thermal fluid is water, a dielectric fluid, or a refrigerant.

17. The cooling system of claim 10 wherein said complementary interlocking heat exchange surfaces are configured to permit separation of the electronic device from the cooling system without disassembly of a fluid connection.

18. The cooling system of claim 10 wherein said at least one condenser comprises a plurality of condensers.

19. The cooling system of claim 18 wherein at least two of said plurality of condensers are in thermal communication with different intermediate heat exchangers.

20. A cooling system for an electronic device containing a plurality of heat generating components, the cooling system comprising:
    a heat pipe circuit comprising:
        a plurality of evaporators, each evaporator being disposed adjacent to and in thermal communication with one of the heat generating components;
        a plurality of condensers disposed adjacent to and in thermal communication with at least one intermediate heat exchanger located at an exterior surface of the electronic device; and
        a fluid connection between the plurality of evaporators and the plurality of condensers;
    a thermal fluid contained within the heat pipe circuit; and
    a final heat absorber disposed adjacent to and in thermal communication with the at least one intermediate heat exchanger, wherein said final heat absorber is adapted for fluid circulation to remove heat from said at least one intermediate heat exchanger to a location remote from said electronic device, and wherein the at least one intermediate heat exchanger and the final heat absorber further comprise complementary interlocking heat exchange surfaces.

21. The cooling system of claim 20 wherein the evaporators are connected in parallel in the heat pipe circuit.

22. The cooling system of claim 20 wherein the interlocking heat exchange surfaces are substantially triangular in cross section.

23. The cooling system of claim 20 wherein thermal tape is provided at the interface between the at least one intermediate heat exchanger and the final heat absorber to provide for enhanced thermal transfer.

24. The cooling system of claim 20 wherein the thermal fluid is water, a dielectric fluid, or a refrigerant.

25. The cooling system of claim 20 wherein said complementary interlocking heat exchange surfaces are configured to permit separation of the electronic device from the cooling system without disassembly of a fluid connection.

26. The cooling system of claim 20 wherein at least two of said plurality of condensers are in thermal communication with different intermediate heat exchangers.

* * * * *

UNITED STATES PATENT AND TRADEMARK OFFICE
CERTIFICATE OF CORRECTION

PATENT NO.    : 6,796,372 B2
DATED         : September 28, 2004
INVENTOR(S)   : Daniel B. Baer It is certified that error appears in the above-identified patent and that said Letters Patent is hereby corrected as shown below:

Title page,
Item [75], Inventor, change "Bear" to -- Baer --.

Signed and Sealed this

Twenty-seventh Day of September, 2005

JON W. DUDAS
*Director of the United States Patent and Trademark Office*